(12) United States Patent
Freer

(10) Patent No.: US 10,520,529 B2
(45) Date of Patent: Dec. 31, 2019

(54) ADAPTERS FOR TESTING ELECTRICAL EQUIPMENT

(71) Applicant: Cooper Technologies Company, Houston, TX (US)

(72) Inventor: Benjamin Avery Freer, Syracuse, NY (US)

(73) Assignee: COOPER TECHNOLOGIES COMPANY, Houston, TX (US)

( * ) Notice: Subject to any disclaimer, the term of this patent is extended or adjusted under 35 U.S.C. 154(b) by 0 days.

(21) Appl. No.: 15/448,261

(22) Filed: Mar. 2, 2017

(65) Prior Publication Data
US 2017/0276702 A1    Sep. 28, 2017

Related U.S. Application Data

(60) Provisional application No. 62/312,050, filed on Mar. 23, 2016.

(51) Int. Cl.
*G01R 1/073* (2006.01)
*G01R 31/28* (2006.01)
*G01R 1/04* (2006.01)

(52) U.S. Cl.
CPC ....... *G01R 1/07378* (2013.01); *G01R 1/0416* (2013.01); *G01R 31/282* (2013.01)

(58) Field of Classification Search
CPC .............. G01R 1/07378; G01R 31/282; G01R 1/0416; G01R 31/31905; G01R 31/31907; G01R 31/31922; G01R 31/3277; G01R 31/3278; G01R 3/00; G01R 31/04; G01R 31/006; H04M 1/24; H04M 3/308;
(Continued)

(56) References Cited

U.S. PATENT DOCUMENTS 4,234,926 A   11/1980   Wallace et al.
4,525,715 A    6/1985   Smith
(Continued)

FOREIGN PATENT DOCUMENTS

| GB | 2204198 | 11/1988 |
|----|---------|---------|
| JP | 2002318047 | 10/2002 |
| WO | 2010119093 | 10/2010 |

OTHER PUBLICATIONS

A. Semenova, International Search Report and Written Opinion issued in PCT/US2017/020472, completion date May 28, 2017, dated Jun. 8, 2017, 6 pages, Federal Institute of Industrial Property, Moscow, Russia.

(Continued)

*Primary Examiner* — Lee E Rodak
(74) *Attorney, Agent, or Firm* — King & Spalding LLP

(57) ABSTRACT

An adapter for testing electrical equipment can include a first receptacle end having at least one first coupling feature, where the at least one first coupling feature is configured to couple to a power source and a first electrical device, where the first receptacle end is configured to receive from the power source at least one first test signal and send the at least one first test signal to the first electrical device. The adapter can also include a sensing device configured to receive at least one first response signal from the first electrical device, where the at least one first response signal is in response to and based on the first electrical device receiving the at least one first test signal.

20 Claims, 4 Drawing Sheets

(58) Field of Classification Search
CPC ........ H04M 3/244; H04M 3/245; H04M 3/30; H04M 3/305; H04M 3/306
See application file for complete search history.

(56) References Cited

U.S. PATENT DOCUMENTS

| | | | |
|---|---|---|---|
| 4,604,505 A | 8/1986 | Henninger | |
| 5,268,644 A | 12/1993 | Klassen et al. | |
| 5,469,064 A | 11/1995 | Kerschner et al. | |
| 5,552,701 A | 9/1996 | Veteran et al. | |
| 5,737,168 A | 4/1998 | Baker | |
| 5,903,718 A | 5/1999 | Marik | |
| 5,946,180 A | 8/1999 | Simpson | |
| 6,006,844 A | 12/1999 | Van Puymbroeck et al. | |
| 6,351,827 B1 | 2/2002 | Co et al. | |
| 6,516,053 B1* | 2/2003 | Ryan | H04M 3/305 379/19 |
| 6,807,035 B1 | 10/2004 | Baldwin et al. | |
| 6,970,534 B1* | 11/2005 | Brumble | H04M 1/24 379/19 |
| 6,992,491 B1* | 1/2006 | Lo | G01R 31/021 324/533 |
| 7,143,659 B2 | 12/2006 | Stout et al. | |
| 7,462,957 B2 | 12/2008 | Camwell et al. | |
| 7,526,971 B2 | 5/2009 | Mandziuk et al. | |
| 7,665,542 B2 | 2/2010 | Stockton | |
| 8,284,066 B2 | 10/2012 | Perten et al. | |
| 8,475,192 B2 | 7/2013 | Kantor | |
| 9,525,247 B2 | 12/2016 | Seff et al. | |
| 2001/0050559 A1 | 12/2001 | Wisler et al. | |
| 2002/0097546 A1 | 7/2002 | Weinberger | |
| 2007/0076334 A1 | 4/2007 | Battani et al. | |
| 2009/0228155 A1 | 9/2009 | Slifkin et al. | |
| 2010/0000792 A1 | 1/2010 | Alberty | |
| 2011/0001486 A1* | 1/2011 | Abouda | G01R 31/007 324/537 |
| 2011/0320056 A1 | 12/2011 | Brown et al. | |
| 2012/0206100 A1 | 8/2012 | Brown et al. | |
| 2013/0001052 A1 | 1/2013 | Kantor | |
| 2013/0065416 A1 | 3/2013 | Kantor | |
| 2013/0162262 A1 | 6/2013 | Johnson et al. | |
| 2013/0181698 A1* | 7/2013 | Rutheiser | G01R 31/40 324/103 R |
| 2013/0182361 A1* | 7/2013 | Sexton | H02H 11/002 361/79 |
| 2013/0207455 A1* | 8/2013 | Doljack | H02J 7/0036 307/9.1 |
| 2014/0077821 A1 | 3/2014 | Reed et al. | |
| 2014/0244058 A1 | 8/2014 | Zweigle et al. | |
| 2015/0316600 A1* | 11/2015 | Davis | G01R 31/021 324/543 |
| 2017/0110872 A1 | 4/2017 | Saarinen et al. | |
| 2018/0087867 A1 | 3/2018 | Tower | |
| 2018/0323549 A1 | 11/2018 | Vogel et al. | |
| 2018/0339377 A1 | 11/2018 | Schneeberger et al. | |

OTHER PUBLICATIONS

A. Semenova, International Search Report and Written Opinion of the International Searching Authority for PCT/US2016/066568, completion date Mar. 15, 2017, dated Apr. 13, 2017, 7 pages, Federal Institute of Industrial Property, Moscow, Russia.

Machine translation of abstract of JP2002318047, via Espacenet, 2 pages.

E. Ushakova, International Search Report and Written Opinion issued in International Application No. PCT/US2015/000213, completion date May 24, 2016, dated Jun. 2, 2016, 7 pages, Federal Institute of Industrial Property, Moscow, Russia.

Zhao Xue, Written Opinion issued in Singapore Patent Application No. 11201705658W, dated Apr. 12, 2018, 7 pages, Intellectual Property Office of Singapore, Singapore.

Extended European Search Report issued in application No. EP 15873771.8, dated Jan. 31, 2019, 14 pages.

Singapore Search Report issued in application No. 11201805516W, dated Feb. 13, 2019, 7 pages.

EP 14166466.4 to provide priority for US 2017/0110872. Apr. 29, 2014.

Partial Supplemental European Search Report under Rule 164, paragraph 1 of the European Patent Convention issued in EP15873771, Oct. 15, 2018, pp. 1-15, European Patent Office, Munich, Germany.

Extended European Search Report issued in EP 16882315.1, dated Aug. 6, 2019, 7 pages.

Chinese Office Action issued in CN 201580072857.7, dated Jun. 27, 2019, 26 pages including translation.

* cited by examiner

ADAPTERS FOR TESTING ELECTRICAL EQUIPMENT

CROSS-REFERENCE TO RELATED APPLICATIONS

This application claims priority under 35 U.S.C. § 119 to United States Provisional Patent Application Ser. No. 62/312,050, titled "Adapters For Testing Electrical Equipment" and filed on Mar. 23, 2016, the entire contents of which are hereby incorporated herein by reference.

TECHNICAL FIELD

The present disclosure relates generally to testing electrical equipment, and more particularly to systems, methods, and devices for adapters for testing electrical equipment.

BACKGROUND

Electrical equipment (e.g., electrical cables, electrical connectors, electrical receptacles, electrical devices) are used in a large number of applications. Electrical equipment often contain components requiring electrical power, and in some cases the required electrical power can have relatively high voltage and current ratings. Receptacles have been designed to provide power to some such devices. Often, receptacles are designed with mechanical interlocking features to ensure that a connector from the electrical device is properly inserted into the receptacle. However, as described further below, such mechanical interlocking features do not provide electrical testing features.

Refrigerated shipping containers (also called reefer containers) are one example of a portable electrical device that requires power. Refrigerated shipping containers are used to ship goods throughout the world. Such refrigerated shipping containers can be transported on trains, trucks, and ships and the containers are often stationed at ports, warehouses, and distribution centers. While the refrigerated containers are located in these various modes of transportation and storage, they often need electrical power to operate the refrigeration unit of the container. The refrigeration units in refrigerated shipping containers typically operate at relatively high voltage and current ratings. For example, many refrigerated shipping containers operate at 480 volts AC and 32 amps.

SUMMARY

In general, in one aspect, the disclosure relates to an adapter for testing electrical equipment. The adapter can include a first receptacle end that includes at least one first coupling feature, where the at least one first coupling feature is configured to couple to a power source and a first electrical device, where the first receptacle end is configured to receive from the power source at least one first test signal and send the at least one first test signal to the first electrical device. The adapter can also include a sensing device configured to receive at least one first response signal from the first electrical device, where the at least one first response signal is in response to and based on the first electrical device receiving the at least one first test signal.

In another aspect, the disclosure can generally relate to a controller of an adapter for testing electrical equipment. The controller can follow a plurality of instructions to initiate a test signal from a power source to an electrical device. The controller can also follow a plurality of instructions to receive a response signal in response to and based on the test signal.

These and other aspects, objects, features, and embodiments will be apparent from the following description and the appended claims.

BRIEF DESCRIPTION OF THE DRAWINGS

The drawings illustrate only example embodiments and are therefore not to be considered limiting in scope, as the example embodiments may admit to other equally effective embodiments. The elements and features shown in the drawings are not necessarily to scale, emphasis instead being placed upon clearly illustrating the principles of the example embodiments. Additionally, certain dimensions or positionings may be exaggerated to help visually convey such principles. In the drawings, reference numerals designate like or corresponding, but not necessarily identical, elements.

DETAILED DESCRIPTION

Figure 1:
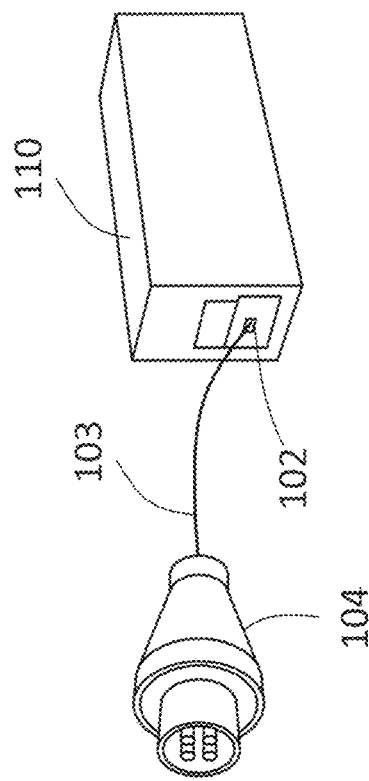
FIG. 1 illustrates an example of a typical reefer container and a reefer receptacle currently used in the art.
Figure 1:
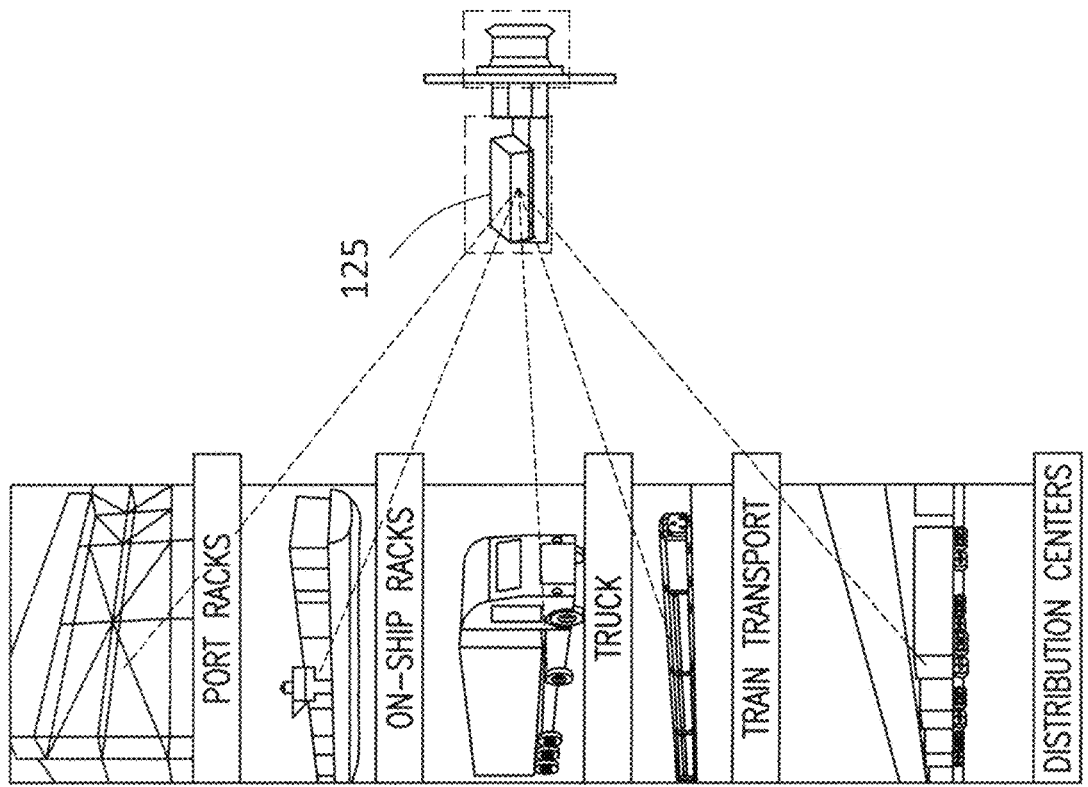

In general, example embodiments provide systems, methods, and devices for adapters for testing electrical equipment. While example adapters for testing electrical equipment that are described herein are directed, for example, to reefer containers, example embodiments can be used with any of a number of electrical equipment used for any of a number of applications. Further, example embodiments can be used in one or more of any of a number of environments, including but not limited to hazardous (e.g., explosive) environments, indoors, outdoors, cold temperatures, hot temperatures, high humidity, marine environments, and low oxygen environments.

As defined herein, electrical equipment can include one or more of a number of electrical devices. Such electrical devices can include, but are not limited to, an electrical cable, an electrical connector, an electrical receptacle, an electrical appliance, a bus bar, a motor, a heater, a controller, and a meter. In other words, an electrical device can be any device that has electricity flowing therethrough and/or uses electricity. Some electrical equipment can have substantially the same coupling features. In such a case, example embodiments can be used on multiple instances of electrical equipment having substantially similar coupling features that couple to an example adapter having complementary coupling features. In other words, example embodiments can be portable and reusable.

For some electrical equipment, the size (e.g., the voltage rating, the current rating) of electrical connectors and electrical conductors coupled to electrical connectors tested using example adapters can vary. In addition, example embodiments described herein can be designed for any type of voltage (e.g., alternating current (AC), direct current (DC)). For example, as stated above, reefer containers often operate at 480 volts AC and 32 amps. Example embodiments described herein can be used in new electrical connectors. In addition, or in the alternative, some example embodiments can be used in retrofit applications of existing electrical connectors.

A user may be any person that interacts, directly or indirectly, with testing electrical equipment. Examples of a user may include, but are not limited to, an engineer, an electrician, a deckhand, a crane operator, an instrumentation and controls technician, a mechanic, an operator, a consultant, a network manager, a contractor, and a manufacturer's representative.

In the foregoing figures showing example embodiments of systems for testing electrical equipment, one or more of the components shown may be omitted, repeated, and/or substituted. Accordingly, example embodiments of systems for testing electrical equipment should not be considered limited to the specific arrangements of components shown in any of the figures. For example, features shown in one or more figures or described with respect to one embodiment can be applied to another embodiment associated with a different figure or description. As another example, the components of the controller described below can be part of the controller or separate from the controller.

In certain example embodiments, electrical equipment for which example systems for testing such electrical equipment are subject to meeting certain standards and/or requirements. For example, the National Electric Code (NEC), the National Electrical Manufacturers Association (NEMA), the International Electrotechnical Commission (IEC), and the Institute of Electrical and Electronics Engineers (IEEE) set standards as to electrical enclosures, wiring, and electrical connections. Use of example embodiments described herein meet (and/or allow a corresponding electrical equipment to meet) such standards when required. In some (e.g., PV solar) applications, additional standards particular to that application may be met by the electrical equipment for which example systems for testing such electrical equipment are used.

If a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. Further, a statement that a particular embodiment (e.g., as shown in a figure herein) does not have a particular feature or component does not mean, unless expressly stated, that such embodiment is not capable of having such feature or component. For example, for purposes of present or future claims herein, a feature or component that is described as not being included in an example embodiment shown in one or more particular drawings is capable of being included in one or more claims that correspond to such one or more particular drawings herein. The numbering scheme for the various components in the figures herein is such that each component is a three digit number and corresponding components in other figures have the identical last two digits.

Example embodiments of systems for testing electrical equipment will be described more fully hereinafter with reference to the accompanying drawings, in which example embodiments of systems for testing electrical equipment are shown. Systems for testing electrical equipment may, however, be embodied in many different forms and should not be construed as limited to the example embodiments set forth herein. Rather, these example embodiments are provided so that this disclosure will be thorough and complete, and will fully convey the scope of systems for testing electrical equipment to those of ordinary skill in the art. Like, but not necessarily the same, elements (also sometimes called components) in the various figures are denoted by like reference numerals for consistency.

Terms such as "first", "second", "end", "top", "bottom", and "side" are used merely to distinguish one component (or part of a component or state of a component) from another. Such terms are not meant to denote a preference or a particular orientation, and are not meant to limit embodiments of systems for testing electrical equipment. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

FIG. 1 illustrates an example of a typical reefer container 105 and a reefer receptacle 125 (a type of electrical equipment) currently used in the art. In addition to the reefer container 105 and the reefer receptacle 125, FIG. 1 shows a refrigeration unit 102 disposed adjacent to the electrical connector 104 (when retracted) at the reefer container 105. The electrical connector 104 is coupled to an electrical cable 103 (collectively called an electrical cable assembly). The electrical cable 103 can have a length that allows a user to pull the electrical connector 104 toward the reefer receptacle 125 so that the electrical connector 104 can be coupled to the reefer receptacle 125. Electrical cables 103 described herein can have any length (e.g., 50 feet, 100 feet) and can be retractable relative to the reefer container 105.

An electrical connector 104 can have any number of a variety of configurations. In the example shown in FIG. 1, the electrical connector 104 (also more simply called a connector 104 herein) is a pin-and-sleeve type of connector with four pins. The configuration of the connector 104 is configured to complement the corresponding configuration of the reefer receptacle 125 shown in FIG. 1. In some cases, to ensure that the connector 104 and the reefer receptacle 125 remain coupled to each other, interlocking features (also called coupling features) are added to the connector 104 and/or the reefer receptacle 125. Such interlocking features can provide added safety by requiring a secure mechanical connection between the reefer receptacle 125 and the connector 104 before power flows between the reefer receptacle 125 and the connector 104.

In the current art, interlocking features for the reefer receptacle 125 and the connector 104 shown in FIG. 1 provide only a mechanical interlock between the two. In other words, they do not provide any information regarding the safety of the electrical connection beyond the reefer receptacle 125, including the connector 104 or any conductors or electrical equipment downstream of the connector 104. For example, because the connector 104 and electrical cable 103 remain attached to the reefer receptacle 125 of the reefer container 105 while the reefer container 105 is transported and stored, it is common for the connector 104 and/or the power cord 103 to become damaged.

Figure 2:
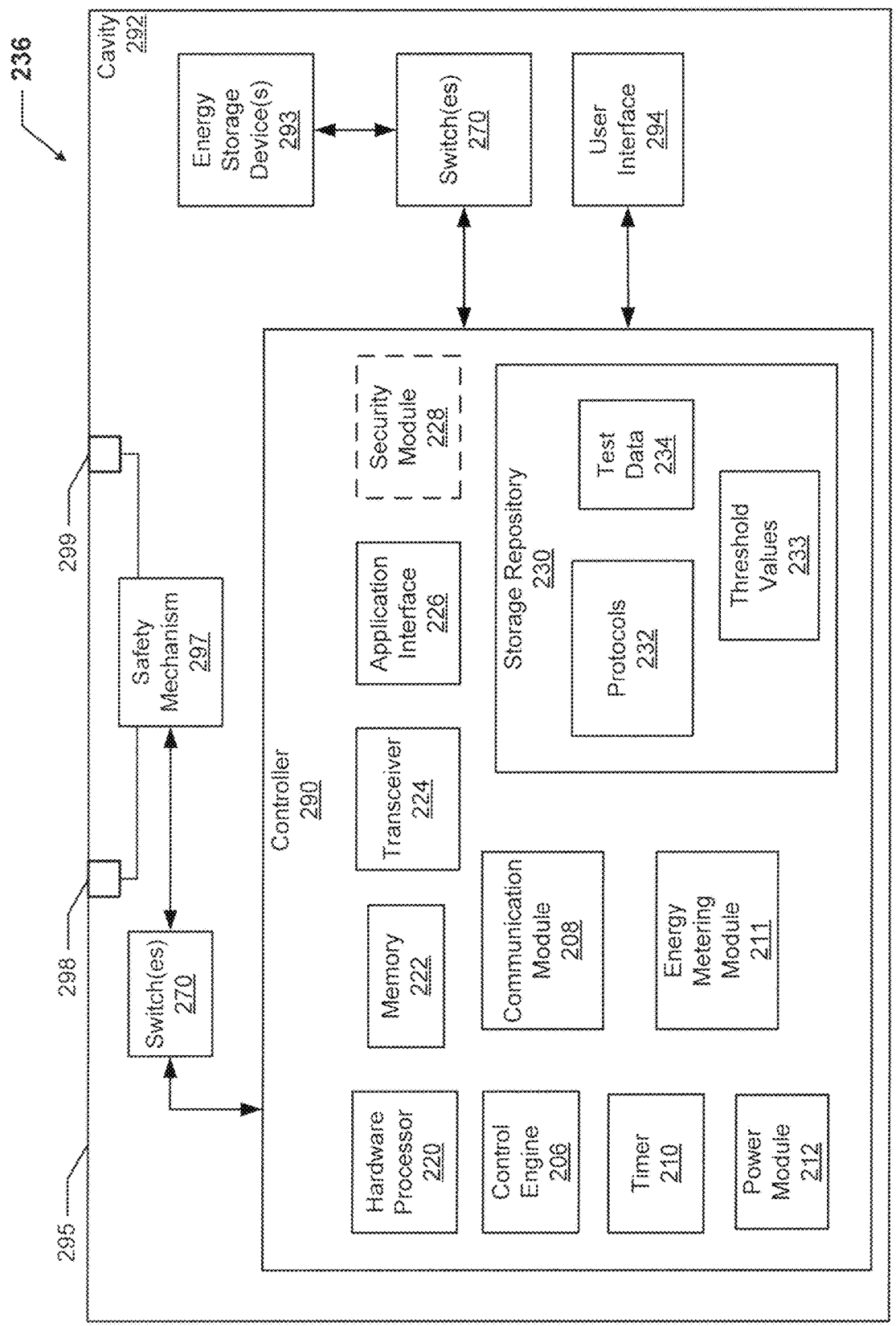
FIG. 2 shows a system diagram of an adapter in accordance with certain example embodiments.

FIG. 2 shows a system diagram of an adapter 236 in accordance with certain example embodiments. Referring to FIGS. 1 and 2, the adapter 236 of FIG. 2 can include one or more of a number of components. For example, as shown in FIG. 2, the adapter 236 can include a controller 290, a user interface 294, one or more receptacle ends (in this case, receptacle end 298 and receptacle end 299), one or more switches 270, a safety mechanism 297, and one or more energy storage devices 293. Any of these components can be located within, on, or external to a housing 295 of the adapter 236.

The components shown in FIG. 2 are not exhaustive, and in some embodiments, one or more of the components shown in FIG. 2 may not be included in an example adapter 236. Further, one or more components shown in FIG. 2 can be rearranged. For example, the energy metering module 211 can be separate from the controller 290 of FIG. 2. As another example, one or more of the switches 270 of FIG. 2 can be part of the controller 290. Any component of the example adapter 236 can be discrete or combined with one or more other components of the adapter 236.

The user interface 294 can be one or more of a number of components that communicate in some way with a user. Examples of a user interface 294 can include, but are not limited to, an indicating light, a display (e.g., a graphical user interface), a speaker, a siren, a horn, a strobe light, a communication port, and a headphone jack. For example, a user interface 294 can be an indicating light that illuminates green when a test results in no problems found and that illuminates in red when a test results in one or more of a number of problems (e.g., a fault, an open circuit) found.

An optional energy storage device 293 can be any number of rechargeable units (e.g., batteries, supercapacitors) that are configured to discharge and provide power to one or more components (e.g., the controller 290) of the adapter 236. The energy storage device 293 can charge in one or more of a number of ways. For example, the energy storage device 293 can be permanently imbedded with the adapter 236, and the adapter 236 can include a connector that allows the energy storage device 293 to charge using power from an external power source (e.g., a wall outlet, electrical equipment coupled to the adapter 236). As another example, the energy storage device 293 can be removed from the adapter 236, and the energy storage device 293 can be placed in a charging cradle that allows the energy storage device 293 to charge. As yet another example, the energy storage device 293 can charge using power from electrical equipment when the adapter 236 is connected to such electrical equipment for testing.

In some cases, one or more of the energy storage devices 293 charge using a different level and/or type of power relative to the level and type of power fed to the adapter 236 for charging the energy storage device 293. In addition, or in the alternative, the power discharged by the energy storage device 293 can be a different level and/or type of power relative to the level and type of power used by one or more of the components (e.g., the controller 290) that operate using such power. In such a case, the power module 212 of the controller 290 (described in more detail below) can include one or more components (e.g., transformer, diodes, inductors) that convert (e.g., transform, invert, step up, step down) power from on level and/or type of power to another level and/or type of power. There can be any number of energy storage devices 293. The energy storage devices 293 can use one or more of any number of battery technologies. Examples of such technologies can include, but are not limited to, nickel-cadmium, nickel-metalhydride, lithium-ion, and alkaline. Aside from a battery, an energy storage device 293 can take on any of a number of other forms found in the art. For example, an energy storage device 293 can include one or more supercapacitors.

The controller 290 can control how and when the energy storage device 293 charges and/or discharges using one or more switches. A switch 270 has an open state (position) and a closed state (position). In the open state, the switch 270 creates an open circuit, which prevents the energy storage device 293 from receiving power for charging and/or to prevent the energy storage device 293 from discharging its reserve power. In the closed state, the switch 270 creates a closed circuit, which allows the energy storage device 293 to receive power for charging and/or to allow the energy storage device 293 to discharge its reserve power. For example, the control engine 206 can close a switch 270 to allow system power that feeds the electrical equipment during normal operating conditions to charge the energy storage device 293.

In certain example embodiments, the position of each switch 270 is controlled by the control engine 206 of the controller 290. Each switch 270 can be any type of device that changes state or position (e.g., opens, closes) based on certain conditions. Examples of a switch 270 can include, but are not limited to, a transistor, a dipole switch, a relay contact, a resistor, and a NOR gate. In certain example embodiments, each switch 270 can operate (e.g., change from a closed position to an open position, change from an open position to a closed position) based on input from the controller 290. In some cases, one or more of the switches 270 can be part of the controller 290.

The safety mechanism 297 can isolate one or more portions of the electrical equipment coupled to the adapter 236 (e.g., at receptacle end 298, at receptacle end 299). For example, when some electrical equipment is being tested, the safety mechanism 297 can prevent that electrical equipment from electrically coupling to other electrical equipment that is also coupled to the adapter 236. The safety mechanism 297 can change configurations. For example, if testing performed on some electrical equipment has been completed satisfactorily, and if that electrical equipment was isolated from other electrical equipment by the safety mechanism 297 during the testing, then the safety mechanism 297 can change its configuration so that the electrical equipment that was tested becomes electrically coupled to the rest of the electrical equipment. In certain example embodiments, as shown in FIG. 2, the safety mechanism 297 can be coupled to and disposed between receptacle end 298 and receptacle end 299.

The safety mechanism 297 can include one or more of a number of components having one or more of a number of configurations. For example, the safety mechanism 297 can include a solenoid and a contactor. As another example, the safety mechanism 297 can include one or more switches (which can be substantially similar to the switches 270 described above). In some cases, there can be one or more switches (which can be substantially similar to the switches 270 described above) disposed between the controller 290 and the safety mechanism 297. In such a case, the control engine 206 of the controller 290 can control the position of each switch 270 and/or switch within the safety mechanism 297. The configuration of the safety mechanism 297 can be controlled by the controller 290.

In certain example embodiments, the adapter 236 couples to electrical equipment using one or more receptacle ends. In this case, the adapter 236 includes receptacle end 298 and receptacle end 299. Each receptacle end is configured to electrically couple to one or more of a number of standard configurations for electrical equipment. For example, if the adapter 236 couples to a reefer receptacle (e.g., reefer receptacle 125), then one of the receptacle ends (e.g., receptacle end 298) can be configured to complement the configuration of the reefer receptacle. The adapter 236 can have any of a number of receptacle ends. When an adapter 236 includes multiple receptacle ends, the adapter 236 can have one or more safety mechanisms 297, where each safety mechanism 297 is coupled to and disposed between two or more of the receptacle ends.

In certain example embodiments, the controller 290 determines and conducts the various tests that are performed on electrical equipment coupled to the adapter 236. In some cases, the controller 290 controls when power is delivered to the energy storage device 293 for storage and/or when the energy storage device 293 releases its stored power. The energy storage device 293 can also control the power module 212 so that power delivered to one or more components of the controller 290 and/or the energy storage device 293 is of the proper type and/or level. The controller 290 can also control one or more other components (e.g., the energy metering module 211) to execute its functions. The controller 290 can be autonomous, self-learning, reporting, controlled by a user, controlled by a network manager, and/or operate in any of a number of other modes.

In certain example embodiments, the controller 290 can include one or more of a number of components. For example, as shown in FIG. 2, such components can include a control engine 206, a communication module 208, a timer 210, a power module 212, an energy metering module 211, a storage repository 230, a hardware processor 220, a memory 222, a transceiver 224, an application interface 226, and an optional security module 228. The controller 290 can correspond to a computer system 318 as described below with regard to FIG. 3.

The controller 290 can interact with one or more components (e.g., a user electrical equipment) of a system for testing electrical equipment. In such a case, the controller 290 can interact using the application interface 226 in accordance with one or more example embodiments. Specifically, the application interface 226 of the controller 290 receives data (e.g., information, communications, instructions, updates to firmware) from and sends data (e.g., information, communications, instructions) to one or more components of a testing system. A user and/or electrical equipment can include an interface to receive data from and send data to the controller 290 in certain example embodiments. Examples of such an interface can include, but are not limited to, a graphical user interface, a touchscreen, an application programming interface, a keyboard, a monitor, a mouse, a web service, a data protocol adapter, some other hardware and/or software, or any suitable combination thereof.

The controller 290 can use its own system or share a system with one or more components (e.g., a user and/or electrical equipment) of the testing system. Such a system can be, or contain a form of, an Internet-based or an intranet-based computer system that is capable of communicating with various software. A computer system includes any type of computing device and/or communication device, including but not limited to the controller 290. Examples of such a system can include, but are not limited to, a desktop computer with LAN, WAN, Internet or intranet access, a laptop computer with LAN, WAN, Internet or intranet access, a smart phone, a server, a server farm, an android device (or equivalent), a tablet, smartphones, and a personal digital assistant (PDA). Such a system can correspond to a computer system as described below with regard to FIG. 3.

Further, such a system can have corresponding software (e.g., user software, network manager software, electrical equipment software). The software can execute on the same or a separate device (e.g., a server, mainframe, desktop personal computer (PC), laptop, personal desktop assistant (PDA), television, cable box, satellite box, kiosk, telephone, mobile phone, or other computing devices) and can be coupled by the communication network (e.g., Internet, Intranet, Extranet, Local Area Network (LAN), Wide Area Network (WAN), or other network communication methods) and/or communication channels, with wire and/or wireless segments according to some example embodiments. The software of one system can be a part of, or operate separately but in conjunction with, the software of another system within the testing system.

The adapter 236 can include a housing 295. The housing 295 can include at least one wall that forms a cavity 292. The housing 295 of the adapter 236 can be used to house one or more components of the adapter 236, including one or more components of the controller 290. For example, as shown in FIG. 2, the controller 290 (which in this case includes the control engine 206, the communication module 208, the timer 210, the power module 212, the storage repository 230, the hardware processor 220, the memory 222, the transceiver 224, the application interface 226, and the optional security module 228), the safety mechanism 297, the energy storage devices 293, and the user interface 294 can be disposed in the cavity 292 formed by the housing 295. In alternative embodiments, any one or more of these or other components of the adapter 236 can be disposed on the housing 295 and/or remotely from the housing 295.

The storage repository 230 can be a persistent storage device (or set of devices) that stores software and data used to assist the controller 290 in communicating with a user and/or electrical equipment within the testing system. In one or more example embodiments, the storage repository 230 stores one or more protocols 232, threshold values 233, and test data 234. The protocols 232 can be any procedures (e.g., a series of method steps) and/or other similar operational procedures that the control engine 206 of the controller 290 follows based on certain conditions at a point in time. The protocols 232 can include any of a number of communication protocols that are used to send and/or receive data between the controller 290 and a user and/or electrical equipment. One or more of the protocols 232 can be a time-synchronized protocol. Examples of such time-synchronized protocols can include, but are not limited to, a highway addressable remote transducer (HART) protocol, a wireless HART protocol, and an International Society of Automation (ISA) 100 protocol. In this way, one or more of the protocols 232 can provide a layer of security to the data transferred within the testing system.

The threshold values 233 can be one or more values that represent a boundary for a range of acceptable values. The threshold values 233 can represent values for any of a number of parameters, including but not limited to a voltage, a current, an amount of power, an amount of charge in an energy storage device 293, an amount of time, and an amount of resistance. When the controller 290 receives a value (e.g., from the energy metering module 211, from the timer 210), the controller 290 can compare that value against one or more of the threshold values 233 to evaluate the value and assess a condition based on the evaluation of the value.

The test data 234 can be any data (e.g., values) associated with (e.g., collected by) the energy metering module 211. Such data can include, but is not limited to, currents, voltages, resistances, power levels, VAR levels, a manufacturer of component of the energy metering module 211, a model number of a component of the energy metering module 211, testing capabilities of the energy metering module 211, and measurements taken by the energy metering module 211.

The storage repository 230 can also store one or more of a number of algorithms (e.g., models, formulas, equations) that can be used by the control engine 206 to evaluate various electrical equipment based on one or more response signals. One or more of these algorithms can be adjusted from time to time by the control engine 206 when actual values vary from the results from an algorithm. Examples of a storage repository 230 can include, but are not limited to, a database (or a number of databases), a file system, a hard drive, flash memory, some other form of solid state data storage, or any suitable combination thereof. The storage repository 230 can be located on multiple physical machines, each storing all or a portion of the protocols 232, the threshold values 233, and/or the test data 234 according to some example embodiments. Each storage unit or device can be physically located in the same or in a different geographic location.

The storage repository 230 can be operatively connected to the control engine 206. In one or more example embodiments, the control engine 206 includes functionality to communicate with a user and the electrical equipment in the testing system. More specifically, the control engine 206 sends information to and/or receives information from the storage repository 230 in order to communicate with a user and the electrical equipment. As discussed below, the storage repository 230 can also be operatively connected to the communication module 208 in certain example embodiments.

In certain example embodiments, the control engine 206 of the controller 290 controls the operation of one or more components (e.g., the communication module 208, the timer 210, the transceiver 224) of the controller 290. For example, the control engine 206 can activate the communication module 208 when the communication module 208 is in "sleep" mode and when the communication module 208 is needed to send data received from another component (e.g., a user, electrical equipment) in the testing system.

As another example, the control engine 206 can acquire the current time using the timer 210. The timer 210 can enable the controller 290 to control the adapter 236 even when the controller 290 has no communication with another component of the testing system. As yet another example, the control engine 206 can direct the energy metering module 211 to measure power information of the electrical equipment coupled to the adapter 236. The control engine 206 can be configured to direct the energy metering module 211 to take particular measurements at a particular time, to receive all measurements (or, generically, data) taken by the energy metering module 211, evaluate (e.g., by comparing with the threshold values 233) all of the measurements received, and communicate the results of the evaluation of the measurements with a third party (e.g., a user, a network manager). Further, as discussed above, the control engine 206 can alter the configuration of the safety mechanism 297 based on the evaluation of the measurements.

The control engine 206 can provide control, communication, and/or other similar signals to a user, a network manager 180, and electrical equipment. Similarly, the control engine 206 can receive control, communication, and/or other similar signals from a user, a network manager 180, and electrical equipment. The control engine 206 can control the energy metering module 211 automatically (for example, based on one or more algorithms stored in the control engine 206 or the storage repository 230) and/or based on control, communication, and/or other similar signals received from a user and electrical equipment. The control engine 206 may include a printed circuit board, upon which the hardware processor 220 and/or one or more discrete components of the controller 290 can be positioned.

In certain example embodiments, the control engine 206 can include an interface that enables the control engine 206 to communicate with the safety mechanism 297, the energy storage device 293, a user, and electrical equipment. Such an interface can operate in conjunction with, or independently of, the protocols 232 used to communicate between the controller 290 and a user and/or the electrical equipment. The control engine 206 (or other components of the controller 290) can also include one or more hardware components and/or software elements to perform its functions. Such components can include, but are not limited to, a universal asynchronous receiver/transmitter (UART), a serial peripheral interface (SPI), a direct-attached capacity (DAC) storage device, an analog-to-digital converter, an inter-integrated circuit ($I^2C$), and a pulse width modulator (PWM).

In certain example embodiments, the communication module 208 of the controller 290 determines and implements the communication protocol (e.g., from the protocols 232 of the storage repository 230) that is used when the control engine 206 communicates with (e.g., sends signals to, receives signals from) a user and/or the electrical equipment (e.g., a reefer receptacle). In some cases, the communication module 208 accesses the test data 234 to determine which communication protocol is used to communicate with a user and/or the electrical equipment associated with the test data 234. In addition, the communication module 208 can interpret the communication protocol of a communication received by a user and/or the electrical equipment so that the control engine 206 can interpret the communication.

The communication module 208 can send and receive data between the controller 290 and a user and/or the electrical equipment. The communication module 208 can send and/or receive data in a given format that follows a particular protocol 232. The control engine 206 can interpret the data packet received from the communication module 208 using the protocol 232 information stored in the storage repository 230. The control engine 206 can also facilitate the data transfer between a user and/or the electrical equipment by converting the data into a format understood by the communication module 208.

The communication module 208 can send data (e.g., protocols 232, threshold values 233, test data 234, default settings, operational information, error codes) directly to and/or retrieve data directly from the storage repository 230. Alternatively, the control engine 206 can facilitate the transfer of data between the communication module 208 and the storage repository 230. The communication module 208 can also provide encryption to data that is sent by the controller 290 and decryption to data that is received by the controller 290. The communication module 208 can also provide one or more of a number of other services with respect to data sent from and received by the controller 290. Such services can include, but are not limited to, data packet routing information and procedures to follow in the event of data interruption.

The timer 210 of the controller 290 can track clock time, intervals of time, an amount of time, and/or any other measure of time. The timer 210 can also count the number of occurrences of an event, with or without respect to time. Alternatively, the control engine 206 can perform the counting function. The timer 210 is able to track multiple time measurements concurrently. The timer 210 can track time periods based on an instruction received from the control engine 206, based on an instruction received from a user, based on an instruction programmed in the software for the controller 290, based on some other condition or from some other component, or from any combination thereof.

The energy metering module 211 of the controller 290 measures one or more components of power (e.g., current, voltage, resistance, VARs, watts) at one or more points within or proximate to the light fixture 102. For example, the energy metering module 211 can verify that 3-phase power is present and balanced in part of the electrical equipment prior to power being fed (e.g., by changing the configuration of the safety mechanism 297) to that part of the electrical equipment. The energy metering module 211 can include any of a number of measuring devices and related devices, including but not limited to a voltmeter, an ammeter, a power meter, an ohmmeter, a current transformer, a potential transformer, and electrical wiring.

The energy metering module 211 can measure a component of power continuously, periodically, based on the occurrence of an event, based on a command received from the control module 206, and/or based on some other factor. The energy metering module 211 can perform any of a number of tests on electrical equipment that is coupled to the adapter 236. Such tests can include, but are not limited to, a ground fault test, a hi-potential test, a continuity test, and a fault location test.

The power module 212 of the controller 290 provides power to one or more other components (e.g., timer 210, control engine 206) of the controller 290. In addition, in certain example embodiments, the power module 212 can provide power to the safety mechanism 297, the energy storage device 293, and/or the user interface 294 of the adapter 236. The power module 212 can include one or more of a number of single or multiple discrete components (e.g., transistor, diode, resistor, integrated circuit), and/or a microprocessor. The power module 212 may include a printed circuit board, upon which the microprocessor and/or one or more discrete components are positioned. In some cases, the power module 212 can include one or more components that allow the power module 212 to measure one or more elements of power (e.g., voltage, current) that is delivered to and/or sent from the power module 212, The power module 212 can include one or more components (e.g., a transformer, a diode bridge, an inverter, a converter) that receives power from a source (e.g., a wall outlet, the energy storage device 293, solar panels disposed on the housing 295 of the adapter 236, electrical equipment coupled to the adapter 236) and generates power of a type (e.g., alternating current, direct current) and level (e.g., 12V, 24V, 220V) that can be used by the other components of the controller 290 and/or by other components of the adapter 236. In addition, or in the alternative, the power module 212 can be a source of power in itself to provide signals to the other components of the controller 290 and/or the rest of the adapter 236. For example, the power module 212 can include a localized photovoltaic power system.

The hardware processor 220 of the controller 290 executes software, algorithms, and firmware in accordance with one or more example embodiments. Specifically, the hardware processor 220 can execute software on the control engine 206 or any other portion of the controller 290, as well as software used by a user and/or the electrical equipment. The hardware processor 220 can be an integrated circuit, a central processing unit, a multi-core processing chip, SoC, a multi-chip module including multiple multi-core processing chips, or other hardware processor in one or more example embodiments. The hardware processor 220 can be known by other names, including but not limited to a computer processor, a microprocessor, and a multi-core processor.

In one or more example embodiments, the hardware processor 220 executes software instructions stored in memory 222. The memory 222 includes one or more cache memories, main memory, and/or any other suitable type of memory. The memory 222 can include volatile and/or non-volatile memory. The memory 222 is discretely located within the controller 290 relative to the hardware processor 220 according to some example embodiments. In certain configurations, the memory 222 can be integrated with the hardware processor 220.

In certain example embodiments, the controller 290 does not include a hardware processor 220. In such a case, the controller 290 can include, as an example, one or more field programmable gate arrays (FPGA), one or more insulated-gate bipolar transistors (IGBTs), and/or integrated circuits (ICs). Using FPGAs, IGBTs, ICs, and/or other similar devices known in the art allows the controller 290 (or portions thereof) to be programmable and function according to certain logic rules and thresholds without the use of a hardware processor. Alternatively, FPGAs, IGBTs, ICs, and/or similar devices can be used in conjunction with one or more hardware processors 220.

The transceiver 224 of the controller 290 can send and/or receive control and/or communication signals. Specifically, the transceiver 224 can be used to transfer data between the controller 290 and a user and/or the electrical equipment. The transceiver 224 can use wired and/or wireless technology. The transceiver 224 can be configured in such a way that the control and/or communication signals sent and/or received by the transceiver 224 can be received and/or sent by another transceiver that is part of a user and/or the electrical equipment. The transceiver 224 can use any of a number of signal types, including but not limited to radio signals.

When the transceiver 224 of the controller 290 uses wireless technology, any type of wireless technology can be used by the transceiver 224 in sending and receiving signals. Such wireless technology can include, but is not limited to, Wi-Fi, visible light communication, cellular networking, and Bluetooth. The transceiver 224 can use one or more of any number of suitable communication protocols (e.g., ISA100, HART) when sending and/or receiving signals. Such communication protocols can be stored in the protocols 232 of the storage repository 230. Further, any transceiver information for a user and/or the electrical equipment can be part of the data stored in the storage repository 230.

Optionally, in one or more example embodiments, the security module 228 secures interactions between the controller 290, a user, and/or the electrical equipment. More specifically, the security module 228 authenticates communication from software based on security keys verifying the identity of the source of the communication. For example, user software may be associated with a security key enabling the software of a user to interact with the controller 290 and/or the electrical equipment. Further, the security module 228 can restrict receipt of information, requests for information, and/or access to information in some example embodiments.

Figure 3:
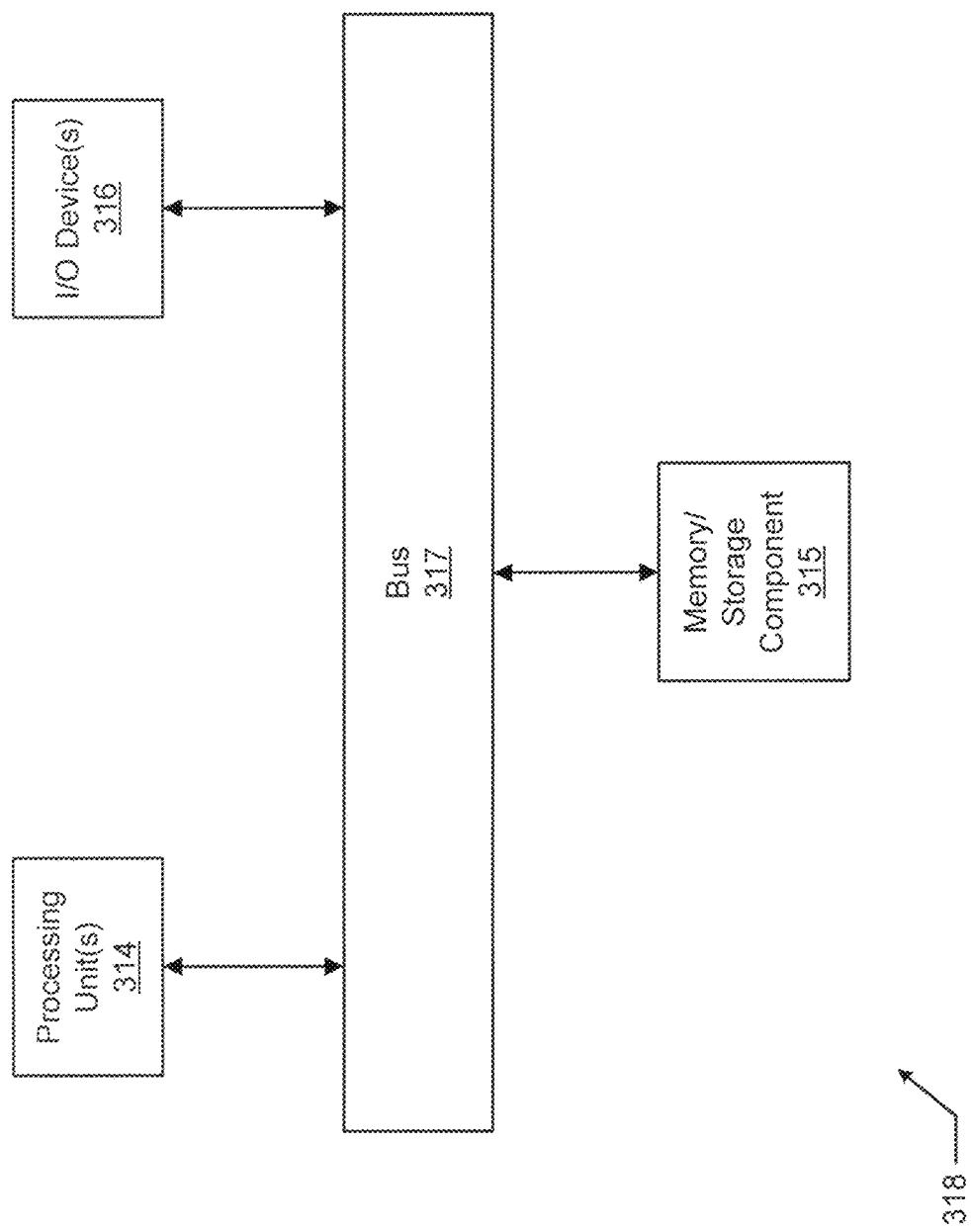
FIG. 3 shows a computing device in accordance with certain example embodiments.

One or more of the functions performed by any of the components (e.g., controller 290) of an example adapter (e.g., adapter 236) can be performed using a computing device 318. An example of a computing device 318 is shown in FIG. 3. The computing device 318 implements one or more of the various techniques described herein, and which is representative, in whole or in part, of the elements described herein pursuant to certain example embodiments. Computing device 318 is one example of a computing device and is not intended to suggest any limitation as to scope of use or functionality of the computing device and/or its possible architectures. Neither should computing device 318 be interpreted as having any dependency or requirement relating to any one or combination of components illustrated in the example computing device 318.

Computing device 318 includes one or more processors or processing units 314, one or more memory/storage components 315, one or more input/output (I/O) devices 316, and a bus 317 that allows the various components and devices to communicate with one another. Bus 317 represents one or more of any of several types of bus structures, including a memory bus or memory controller, a peripheral bus, an accelerated graphics port, and a processor or local bus using any of a variety of bus architectures. Bus 317 includes wired and/or wireless buses.

Memory/storage component 315 represents one or more computer storage media. Memory/storage component 315 includes volatile media (such as random access memory (RAM)) and/or nonvolatile media (such as read only memory (ROM), flash memory, optical disks, magnetic disks, and so forth). Memory/storage component 315 includes fixed media (e.g., RAM, ROM, a fixed hard drive, etc.) as well as removable media (e.g., a Flash memory drive, a removable hard drive, an optical disk, and so forth).

One or more I/O devices 316 allow a customer, utility, or other user to enter commands and information to computing device 318, and also allow information to be presented to the customer, utility, or other user and/or other components or devices. Examples of input devices include, but are not limited to, a keyboard, a cursor control device (e.g., a mouse), a microphone, and a scanner. Examples of output devices include, but are not limited to, a display device (e.g., a monitor or projector), speakers, a printer, and a network card.

Various techniques are described herein in the general context of software or program modules. Generally, software includes routines, programs, objects, components, data structures, and so forth that perform particular tasks or implement particular abstract data types. An implementation of these modules and techniques are stored on or transmitted across some form of computer readable media. Computer readable media is any available non-transitory medium or non-transitory media that is accessible by a computing device. By way of example, and not limitation, computer readable media includes "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which is used to store the desired information and which is accessible by a computer.

The computer device 318 is connected to a network (not shown) (e.g., a local area network (LAN), a wide area network (WAN) such as the Internet, or any other similar type of network) via a network interface connection (not shown) according to some example embodiments. Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means take other forms, now known or later developed, in other example embodiments. Generally speaking, the computer system 318 includes at least the minimal processing, input, and/or output means necessary to practice one or more embodiments.

Further, those skilled in the art will appreciate that one or more elements of the aforementioned computer device 318 is located at a remote location and connected to the other elements over a network in certain example embodiments. Further, one or more embodiments is implemented on a distributed system having one or more nodes, where each portion of the implementation (e.g., controller 290) is located on a different node within the distributed system. In one or more embodiments, the node corresponds to a computer system. Alternatively, the node corresponds to a processor with associated physical memory in some example embodiments. The node alternatively corresponds to a processor with shared memory and/or resources in some example embodiments.

Figure 4:
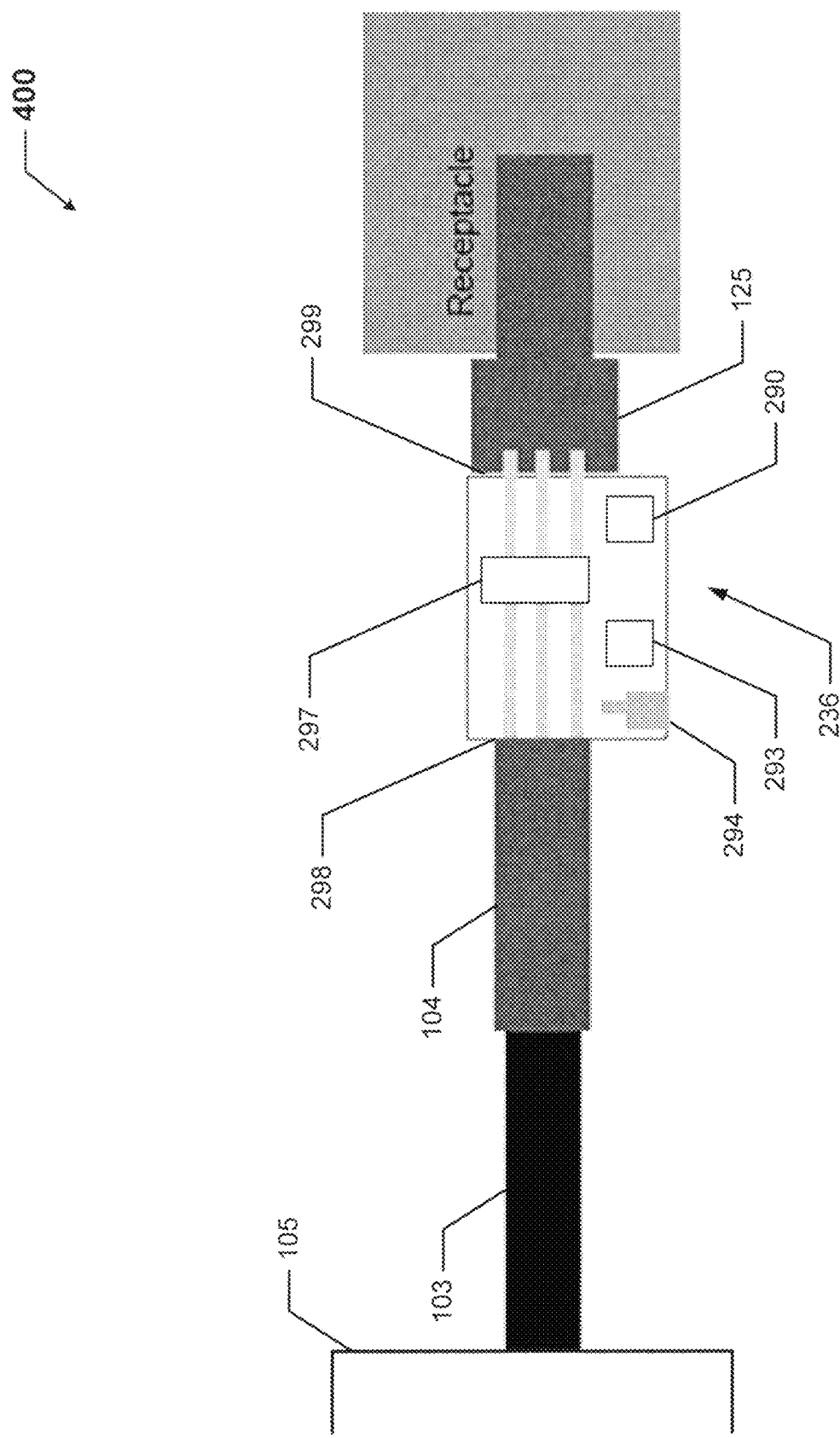
FIG. 4 shows a block diagram of a system for testing electrical equipment in accordance with certain example embodiments.

FIG. 4 shows a block diagram of a system 400 for testing electrical equipment in accordance with certain example embodiments. The system can include an example adapter 236, as described above with respect to FIG. 2, disposed between and coupled to an electrical connector 104 and a reefer receptacle 125, both described above with respect to FIG. 1. Specifically, one receptacle end 298 of the adapter 236 is electrically coupled to the electrical connector 104, and another receptacle end 299 of the adapter 236 is electrically coupled to the reefer receptacle 125. The adapter 236 can perform testing on the electrical connector 104 (which can include the electrical cable 103) and/or the reefer receptacle 125 (which can include any other electrical equipment disposed on or within the reefer container 105). In this example, the electrical cable 103, the electrical connector 104, the reefer receptacle 125, and any other electrical equipment disposed on or within the reefer container 105 can collectively be called the electrical equipment.

Example embodiments can provide for measuring and monitoring the health of electrical equipment. Specifically, when an example adapter is coupled to electrical equipment (e.g., electrical cable, electrical connector, motor, reefer receptacle), the adapter can perform one or more of a number of tests to evaluate the health and integrity of the electrical equipment. Example embodiments can be used for predictive maintenance, preventative maintenance, and/or to assess damage after an adverse condition (e.g., ground fault, overcurrent).

Example embodiments can also evaluate one or more parameters of specific electrical equipment over time, providing an indication of an imminent failure of the electrical equipment. In some cases, example embodiments can include a power source (e.g., an energy storage device) that allows for the un-powered testing of electrical equipment. Further, example embodiments can include a safety mechanism that prevents the electrical equipment from being placed in service (from receiving power from a system power source) during testing. In addition, if the electrical equipment is determined to have failed or is in the process of failing, the safety mechanism of example embodiments can prevent the electrical equipment from being placed in service until the electrical equipment is repaired or replaced.

Example embodiments can be used in any of a number of environments. In some cases, example embodiments can be used in hazardous (e.g., explosion-proof) environments. Further, example embodiments can be used in environments where one or more applicable industry standards must be met. In addition, example embodiments can control the electrical connection of two or more components of electrical equipment. By evaluating the existence of adverse electrical conditions before allowing power to flow between such components, the risk of damage to equipment and/or personnel can be greatly reduced.

Example embodiments can determine whether an adverse electrical condition exists. In addition, example embodiments can interactively communicate (e.g., through the user interface, using the transceiver) with a user (e.g., a network manager, a maintenance department, an inventory management system) for the dissemination of information regarding the adverse electrical condition or lack thereof. Example embodiments have a number of benefits over the present art, including but not limited to reduced materials, simple installation and maintenance, increased reliability, enhanced user experience, reusable equipment, ability to test a number of different electrical equipment, and decreased risk of loss.

Example embodiments can be used with any type of electrical equipment in any of a number of applications. For example, example embodiments can be used with electrical equipment used for residential, commercial, and/or industrial applications. Example embodiments can be used in various hazardous and non-hazardous area installations where shock and fire hazards are a significant concern. Example embodiments can be used with a temporary connection and/or other applications where electrical equipment is subject to damage and poses a safety risk if compromised.

Example embodiments can be used with residential outlets, residential appliances, and other similar residential applications. With the effectiveness of example embodiments, one or more entities that maintain industry standards may incorporate the use of example embodiments (or the functional equivalent) into applicable standards. Further, example embodiments can have metering capability, which allows for some level of detection of a loss of phase or phase imbalance. In addition, example embodiments can be added to or removed from electrical equipment (with or without power fed to the electrical equipment) at any time.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. An adapter for testing electrical equipment, the adapter comprising:
    a first receptacle end comprising at least one first connector end, wherein the at least one first connector end is configured to couple to a power source connector end of a first high voltage electrical device, wherein the first receptacle end is configured to send at least one first test signal, generated by a power source, to the first high voltage electrical device, wherein the at least one first test signal is configured to test a first electrical integrity of the first high voltage electrical device;
    a second receptacle end comprising at least one second connector end, wherein the at least one second connector end is configured to couple to an electrical device connector end of the power source, wherein the power source connector end of the first high voltage electrical device and the electrical device connector end of the power source are pre-configured to directly couple to each other in an absence of the adapter, and wherein the power source provides primary power to the first high voltage electrical device during normal operating conditions; and
    a sensing device configured to receive at least one first response signal from the first high voltage electrical device, wherein the at least one first response signal is in response to and based on the first high voltage electrical device receiving the at least one first test signal, wherein the at least one first response signal comprises information about the electrical integrity of the first high voltage electrical device,
    wherein the at least one first response signal provides an indication of a phase-to-phase fault or a phase-to-ground fault.

2. The adapter of claim 1, wherein the first receptacle end is further configured to couple to the power source connector of a second high voltage electrical device, wherein the first receptacle end is further configured to send at least one second test signal to the second high voltage electrical device, wherein the at least one second test signal is configured to test a second electrical integrity of the second high voltage electrical device, wherein the sensing device is further configured to receive at least one second response signal from the second high voltage electrical device, wherein the at least one second response signal is in response to and based on the second high voltage electrical device receiving the at least one second test signal.

3. The adapter of claim 1, further comprising:
    a safety mechanism disposed between and in communication with the first receptacle end and the second receptacle end.

4. The adapter of claim 3, wherein the safety mechanism prohibits the electrical connection between the first high voltage electrical device and the power source when the at least one first response signal falls outside a range of acceptable values.

5. The adapter of claim 3, wherein the safety mechanism allows the electrical connection between the first high voltage electrical device and the power source when the at least one first response signal falls within a range of acceptable values.

6. The adapter of claim 3, wherein the safety mechanism comprises a contactor.

7. The adapter of claim 3, wherein the safety mechanism changes state based on instructions received from a controller.

8. The adapter of claim 1, wherein the sensing device is part of a controller, wherein the controller controls the at least one first test signal and evaluates the at least one first response signal measured by the sensing device.

9. The adapter of claim 8, wherein the controller is configured to control at least one switch to regulate the at least one test signal.

10. The adapter of claim 8, wherein the controller comprises a timer for measuring an amount of time between the at least one first test signal and the at least one first response signal.

11. The adapter of claim 1, wherein the sensing device comprises an energy metering module for measuring the at least one first response signal.

12. The adapter of claim 1, further comprising:
a rechargeable energy storage device disposed within a housing of the adapter, wherein the rechargeable energy storage device provides the at least one first test signal.

13. The adapter of claim 1, wherein the at least one first response signal comprises a voltage.

14. The adapter of claim 1, further comprising:
a user interface that communicates an evaluation of the first electrical integrity based on the at least one first response signal.

15. The adapter of claim 14, wherein the user interface comprises an indicating light or a display.

16. The adapter of claim 1, wherein the power source connector end of the high voltage electrical device and the at least one first connector end are each configured as a plug, and wherein the electrical device connector end of the power source and the at least one second connector end are each configured as a receptacle for receiving the plug.

17. A controller of an adapter for testing electrical equipment, the controller comprising:
a metering module configured to receive a response signal from a high voltage electrical device; and
a control engine coupled to the metering module, wherein the control engine follows a plurality of instructions to:
initiate, using reserve power provided by an energy storage device of the adapter, a test signal to the high voltage electrical device through at least one first connector end of the adapter coupled to a power source connector end of the high voltage electrical device, wherein the test signal is configured to test for fault potential at the high voltage electrical device;
receive the response signal from the metering module in response to and based on the test signal, wherein the response signal comprises information about the electrical integrity of the high voltage electrical device;
evaluate the electrical integrity of the high voltage electrical device based on the response signal relative to historical response signals received in response to historical test signals initiated from a power source to the high voltage electrical device, wherein at least one second connector end of the adapter is coupled to an electrical device connector end of the power source, wherein the power source connector end of the high voltage electrical device and the electrical device connector end of the power source are pre-configured to be coupled to each other in an absence of the adapter; and
communicate when a fault event of the high voltage electrical device is likely to occur,
wherein the historical test signals are further configured to test for the fault potential at the high voltage electrical device,
wherein the control engine is disposed between the power source and the high voltage electrical device,
wherein the power source provides power to the high voltage electrical device through the controller during the normal operating conditions.

18. The controller of claim 17, further comprising:
a memory that stores the plurality of instructions; and
a hardware processor that executes the plurality of instructions for the control engine.

19. The controller of claim 17, further comprising:
a switch having a first position and a second position, wherein the power signal flows from the power source to the high voltage electrical device when the switch is in the first position, and wherein the power signal is prevented from flowing from the power source to the high voltage electrical device when the switch is in the second position.

20. An adapter for testing electrical equipment, the adapter comprising:
a first receptacle end comprising at least one first connector end, wherein the at least one first connector end is configured to couple to a power source connector end of a high voltage electrical device, wherein the first receptacle end is configured to send at least one first test signal, generated by a power source, to the high voltage electrical device, wherein the at least one first test signal is configured to test a first electrical integrity of the high voltage electrical device;
a second receptacle end comprising at least one second connector end, wherein the at least one second connector end is configured to couple to an electrical device connector end of the power source, wherein the power source connector end of the high voltage electrical device and the electrical device connector end of the power source are pre-configured to directly couple to each other in an absence of the adapter, and wherein the power source provides primary power to the high voltage electrical device during normal operating conditions;
a sensing device configured to receive at least one first response signal from the high voltage electrical device, wherein the at least one first response signal is in response to and based on the high voltage electrical device receiving the at least one first test signal, wherein the at least one first response signal comprises information about the electrical integrity of the high voltage electrical device; and
a safety mechanism that prohibits the electrical connection between the high voltage electrical device and the power source when the at least one first response signal falls outside a range of acceptable values.

* * * * *